(12) United States Patent
Fine et al.

(10) Patent No.: US 11,733,359 B2
(45) Date of Patent: Aug. 22, 2023

(54) CONFIGURABLE ARRAY OF SINGLE-PHOTON DETECTORS

(71) Applicant: APPLE INC., Cupertino, CA (US)

(72) Inventors: Nadav Fine, Herzliya (IL); Amir Nevet, Haifa (IL); Oz Barak, Tel Aviv (IL)

(73) Assignee: APPLE INC., Cupertino, CA (US)

(*) Notice: Subject to any disclaimer, the term of this patent is extended or adjusted under 35 U.S.C. 154(b) by 420 days.

(21) Appl. No.: 17/079,548

(22) Filed: Oct. 26, 2020

(65) Prior Publication Data

US 2021/0165083 A1 Jun. 3, 2021

Related U.S. Application Data

(60) Provisional application No. 62/942,761, filed on Dec. 3, 2019.

(51) Int. Cl.
*G01S 7/48* (2006.01)
*G01S 7/4863* (2020.01)
(Continued)

(52) U.S. Cl.
CPC .......... *G01S 7/4863* (2013.01); *G01S 7/4865* (2013.01); *G01S 17/894* (2020.01); *H01L 27/14856* (2013.01)

(58) Field of Classification Search
USPC ...................................................... 356/5.01
See application file for complete search history.

(56) References Cited

U.S. PATENT DOCUMENTS 4,623,237 A 11/1986 Kaneda et al.
4,757,200 A 7/1988 Shepherd
(Continued)

FOREIGN PATENT DOCUMENTS

CA 2605339 C 10/1994
CN 201054040 Y 4/2008
(Continued)

OTHER PUBLICATIONS

CN Application # 201810571820.4 Office Action dated Sep. 9, 2022.
(Continued)

*Primary Examiner* — James R Hulka
(74) *Attorney, Agent, or Firm* — Kligler & Associates Patent Attorneys Ltd

(57) ABSTRACT

Optical sensing apparatus includes at least one semiconductor substrate and a first array of single-photon detectors, which are disposed on the at least one semiconductor substrate, and second array of counters, which are disposed on the at least one semiconductor substrate and are configured to count electrical pulses output by the single-photon detectors. Routing and aggregation logic is configured, in response to a control signal, to connect the single-photon detectors to the counters in a first mode in which each of at least some of the counters aggregates and counts the electrical pulses output by a respective first group of one or more of the single-photon detectors, and in a second mode in which each of the at least some of the counters aggregates and counts the electrical pulses output by a respective second group of two or more of the single-photon detectors.

20 Claims, 7 Drawing Sheets

(51) Int. Cl.
   *G01S 17/894* (2020.01)
   *G01S 7/4865* (2020.01)
   *H01L 27/148* (2006.01)

(56) References Cited

U.S. PATENT DOCUMENTS

| | | | |
|---|---|---|---|
| 5,164,823 | A | 11/1992 | Keeler |
| 5,270,780 | A | 12/1993 | Moran et al. |
| 5,373,148 | A | 12/1994 | Dvorkis et al. |
| 5,699,149 | A | 12/1997 | Kuroda et al. |
| 6,301,003 | B1 | 10/2001 | Shirai et al. |
| 6,384,903 | B1 | 5/2002 | Fuller |
| 6,710,859 | B2 | 3/2004 | Shirai et al. |
| 7,126,218 | B1 | 10/2006 | Darveaux et al. |
| 7,193,690 | B2 | 3/2007 | Ossig et al. |
| 7,303,005 | B2 | 12/2007 | Reis et al. |
| 7,405,812 | B1 | 7/2008 | Bamji |
| 7,508,496 | B2 | 3/2009 | Mettenleiter et al. |
| 7,800,067 | B1 | 9/2010 | Rajavel et al. |
| 7,800,739 | B2 | 9/2010 | Rohner et al. |
| 7,812,301 | B2 | 10/2010 | Oike et al. |
| 7,969,558 | B2 | 6/2011 | Hall |
| 8,193,482 | B2 | 6/2012 | Itsler |
| 8,259,293 | B2 | 9/2012 | Andreou |
| 8,275,270 | B2 | 9/2012 | Shushakov et al. |
| 8,279,418 | B2 | 10/2012 | Yee et al. |
| 8,355,117 | B2 | 1/2013 | Niclass |
| 8,405,020 | B2 | 3/2013 | Menge |
| 8,594,425 | B2 | 11/2013 | Gurman et al. |
| 8,675,181 | B2 | 3/2014 | Hall |
| 8,736,818 | B2 | 5/2014 | Weimer et al. |
| 8,766,164 | B2 | 7/2014 | Sanfilippo et al. |
| 8,766,808 | B2 | 7/2014 | Hogasten |
| 8,891,068 | B2 | 11/2014 | Eisele et al. |
| 8,925,814 | B1 | 1/2015 | Schneider et al. |
| 8,963,069 | B2 | 2/2015 | Drader et al. |
| 9,002,511 | B1 | 4/2015 | Hickerson et al. |
| 9,024,246 | B2 | 5/2015 | Jiang et al. |
| 9,052,356 | B2 | 6/2015 | Chu et al. |
| 9,076,707 | B2 | 7/2015 | Harmon |
| 9,016,849 | B2 | 8/2015 | Duggal et al. |
| 9,267,787 | B2 | 2/2016 | Shpunt et al. |
| 9,335,220 | B2 | 5/2016 | Shpunt et al. |
| 9,354,332 | B2 | 5/2016 | Zwaans et al. |
| 9,465,111 | B2 | 10/2016 | Wilks et al. |
| 9,516,248 | B2 | 12/2016 | Cohen et al. |
| 9,709,678 | B2 | 7/2017 | Matsuura |
| 9,736,459 | B2 | 8/2017 | Mor et al. |
| 9,739,881 | B1 | 8/2017 | Pavek et al. |
| 9,761,049 | B2 | 9/2017 | Naegle et al. |
| 9,786,701 | B2 | 10/2017 | Mellot et al. |
| 9,810,777 | B2 | 11/2017 | Williams et al. |
| 9,874,635 | B1 | 1/2018 | Eichenholz et al. |
| 10,063,844 | B2 | 8/2018 | Adam et al. |
| 10,067,224 | B2 | 9/2018 | Moore et al. |
| 10,132,616 | B2 | 11/2018 | Wang |
| 10,215,857 | B2 | 2/2019 | Oggier et al. |
| 10,269,104 | B2 | 4/2019 | Hannuksela et al. |
| 10,386,487 | B1 | 8/2019 | Wilton et al. |
| 10,424,683 | B1 | 9/2019 | Do Valle et al. |
| 10,613,203 | B1 | 4/2020 | Rekow et al. |
| 10,782,393 | B2 | 9/2020 | Dussan et al. |
| 10,955,552 | B2 * | 3/2021 | Fine ............... G01S 17/32 |
| 11,555,900 | B1 * | 1/2023 | Barak ............... G01S 7/487 |
| 2001/0020673 | A1 | 9/2001 | Zappa et al. |
| 2002/0071126 | A1 | 6/2002 | Shirai et al. |
| 2002/0131035 | A1 | 9/2002 | Watanabe et al. |
| 2002/0154054 | A1 | 10/2002 | Small |
| 2002/0186362 | A1 | 12/2002 | Shirai et al. |
| 2004/0051859 | A1 | 3/2004 | Flockencier |
| 2004/0135992 | A1 | 7/2004 | Munro |
| 2004/0212863 | A1 | 10/2004 | Schanz et al. |
| 2006/0044546 | A1 | 3/2006 | Lewin et al. |
| 2006/0106317 | A1 | 5/2006 | McConnell et al. |
| 2007/0145136 | A1 | 6/2007 | Wiklof et al. |
| 2009/0009747 | A1 | 1/2009 | Wolf et al. |
| 2009/0262760 | A1 | 10/2009 | Krupkin et al. |
| 2009/0273770 | A1 | 11/2009 | Bauhahn et al. |
| 2009/0275841 | A1 | 11/2009 | Melendez et al. |
| 2010/0019128 | A1 | 1/2010 | Itzler |
| 2010/0045965 | A1 | 2/2010 | Meneely |
| 2010/0096459 | A1 | 4/2010 | Gurevich |
| 2010/0121577 | A1 | 5/2010 | Zhang et al. |
| 2010/0250189 | A1 | 9/2010 | Brown |
| 2010/0286516 | A1 | 11/2010 | Fan et al. |
| 2011/0006190 | A1 | 1/2011 | Alameh et al. |
| 2011/0128524 | A1 | 6/2011 | Vert et al. |
| 2011/0181864 | A1 | 7/2011 | Schmitt et al. |
| 2012/0038904 | A1 | 2/2012 | Fossum et al. |
| 2012/0075615 | A1 | 3/2012 | Niclass et al. |
| 2012/0132636 | A1 | 5/2012 | Moore |
| 2012/0153120 | A1 | 6/2012 | Baxter |
| 2012/0154542 | A1 | 6/2012 | Katz et al. |
| 2012/0176476 | A1 | 7/2012 | Schmidt et al. |
| 2012/0249998 | A1 | 10/2012 | Eisele et al. |
| 2012/0287242 | A1 | 11/2012 | Gilboa et al. |
| 2012/0294422 | A1 | 11/2012 | Cheung et al. |
| 2013/0015331 | A1 | 1/2013 | Birk et al. |
| 2013/0079639 | A1 | 3/2013 | Hoctor et al. |
| 2013/0092846 | A1 | 4/2013 | Henning et al. |
| 2013/0107016 | A1 | 5/2013 | Federspiel |
| 2013/0208258 | A1 | 8/2013 | Eisele et al. |
| 2013/0236171 | A1 | 9/2013 | Saunders |
| 2013/0258099 | A1 | 10/2013 | Ovsiannikov et al. |
| 2013/0278917 | A1 | 10/2013 | Korekado et al. |
| 2013/0300838 | A1 | 11/2013 | Borowski |
| 2013/0342835 | A1 | 12/2013 | Blacksberg |
| 2014/0027606 | A1 | 1/2014 | Raynor et al. |
| 2014/0071433 | A1 | 3/2014 | Eisele et al. |
| 2014/0077086 | A1 | 3/2014 | Batkilin et al. |
| 2014/0078491 | A1 | 3/2014 | Eisele et al. |
| 2014/0162714 | A1 | 6/2014 | Kim et al. |
| 2014/0191115 | A1 | 7/2014 | Webster et al. |
| 2014/0198198 | A1 | 7/2014 | Geissbuehler et al. |
| 2014/0231630 | A1 | 8/2014 | Rae et al. |
| 2014/0240317 | A1 | 8/2014 | Go et al. |
| 2014/0240691 | A1 | 8/2014 | Mheen et al. |
| 2014/0268127 | A1 | 9/2014 | Day |
| 2014/0300907 | A1 | 10/2014 | Kimmel |
| 2014/0321862 | A1 | 10/2014 | Frohlich et al. |
| 2014/0353471 | A1 | 12/2014 | Raynor et al. |
| 2015/0041625 | A1 | 2/2015 | Dutton et al. |
| 2015/0062558 | A1 | 3/2015 | Koppal et al. |
| 2015/0131080 | A1 | 5/2015 | Retterath et al. |
| 2015/0163429 | A1 | 6/2015 | Dai et al. |
| 2015/0192676 | A1 | 7/2015 | Kotelnikov et al. |
| 2015/0200222 | A1 | 7/2015 | Webster |
| 2015/0200314 | A1 | 7/2015 | Webster |
| 2015/0260830 | A1 | 9/2015 | Gosh et al. |
| 2015/0285625 | A1 | 10/2015 | Deane et al. |
| 2015/0362585 | A1 | 12/2015 | Gosh et al. |
| 2015/0373322 | A1 | 12/2015 | Goma et al. |
| 2016/0003944 | A1 | 1/2016 | Schmidtke et al. |
| 2016/0041266 | A1 | 2/2016 | Smits |
| 2016/0072258 | A1 | 3/2016 | Seurin et al. |
| 2016/0080709 | A1 | 3/2016 | Viswanathan et al. |
| 2016/0259038 | A1 | 9/2016 | Retterath et al. |
| 2016/0259057 | A1 | 9/2016 | Ito |
| 2016/0274222 | A1 | 9/2016 | Yeun |
| 2016/0334508 | A1 | 11/2016 | Hall et al. |
| 2016/0344965 | A1 | 11/2016 | Grauer |
| 2017/0006278 | A1 | 1/2017 | Vandame et al. |
| 2017/0038459 | A1 | 2/2017 | Kubacki et al. |
| 2017/0052065 | A1 | 2/2017 | Sharma et al. |
| 2017/0067734 | A1 | 3/2017 | Heidemann et al. |
| 2017/0131388 | A1 | 5/2017 | Campbell et al. |
| 2017/0131718 | A1 | 5/2017 | Matsumura et al. |
| 2017/0139041 | A1 | 5/2017 | Drader et al. |
| 2017/0176577 | A1 | 6/2017 | Halliday |
| 2017/0176579 | A1 | 6/2017 | Niclass et al. |
| 2017/0179173 | A1 | 6/2017 | Mandai et al. |
| 2017/0184450 | A1 | 6/2017 | Doylend et al. |
| 2017/0184704 | A1 | 6/2017 | Yang et al. |
| 2017/0184709 | A1 | 6/2017 | Kenzler et al. |

(56) References Cited

U.S. PATENT DOCUMENTS

| | | |
|---|---|---|
| 2017/0188016 A1 | 6/2017 | Hudman |
| 2017/0219695 A1 | 8/2017 | Hall et al. |
| 2017/0242102 A1 | 8/2017 | Dussan et al. |
| 2017/0242108 A1 | 8/2017 | Dussan et al. |
| 2017/0257617 A1 | 9/2017 | Retterath |
| 2017/0269209 A1 | 9/2017 | Hall et al. |
| 2017/0303789 A1 | 10/2017 | Tichauer et al. |
| 2017/0329010 A1 | 11/2017 | Warke et al. |
| 2017/0343675 A1 | 11/2017 | Oggier et al. |
| 2017/0356796 A1 | 12/2017 | Nishio |
| 2017/0356981 A1 | 12/2017 | Yang et al. |
| 2018/0045816 A1 | 2/2018 | Jarosinski et al. |
| 2018/0059220 A1 | 3/2018 | Irish et al. |
| 2018/0062345 A1 | 3/2018 | Bills et al. |
| 2018/0081032 A1 | 3/2018 | Torruellas et al. |
| 2018/0081041 A1 | 3/2018 | Niclass et al. |
| 2018/0115762 A1 | 4/2018 | Bulteel et al. |
| 2018/0131449 A1 | 5/2018 | Kare et al. |
| 2018/0167602 A1 | 6/2018 | Pacala et al. |
| 2018/0203247 A1 | 7/2018 | Chen et al. |
| 2018/0205943 A1 | 7/2018 | Trail |
| 2018/0209846 A1 | 7/2018 | Mandai et al. |
| 2018/0259645 A1 | 9/2018 | Shu et al. |
| 2018/0299554 A1 | 10/2018 | Van Dyck et al. |
| 2018/0341009 A1 | 11/2018 | Niclass et al. |
| 2019/0004156 A1 | 1/2019 | Niclass et al. |
| 2019/0011556 A1 | 1/2019 | Pacala et al. |
| 2019/0011567 A1 | 1/2019 | Pacala et al. |
| 2019/0018117 A1 | 1/2019 | Perenzoni et al. |
| 2019/0018118 A1 | 1/2019 | Perenzoni et al. |
| 2019/0018119 A1 | 1/2019 | Laifenfeld et al. |
| 2019/0018143 A1 | 1/2019 | Thayer et al. |
| 2019/0037120 A1 | 1/2019 | Ohki |
| 2019/0056497 A1 | 2/2019 | Pacala et al. |
| 2019/0094364 A1 | 3/2019 | Fine et al. |
| 2019/0170855 A1 | 6/2019 | Keller et al. |
| 2019/0178995 A1 | 6/2019 | Tsai et al. |
| 2019/0257950 A1 | 8/2019 | Patanwala et al. |
| 2019/0277952 A1 | 9/2019 | Beuschel et al. |
| 2019/0361404 A1 | 11/2019 | Mautner et al. |
| 2020/0142033 A1 | 5/2020 | Shand |
| 2020/0233068 A1 | 7/2020 | Henderson et al. |
| 2020/0256669 A1 | 8/2020 | Roth et al. |
| 2020/0256993 A1 | 8/2020 | Oggier |
| 2020/0309955 A1 | 10/2020 | Laflaqueire et al. |
| 2020/0314294 A1 | 10/2020 | Schoenlieb et al. |
| 2020/0386890 A1 | 10/2020 | Oggier et al. |
| 2022/0244391 A1* | 8/2022 | Mandai ............... G01S 7/4816 |

FOREIGN PATENT DOCUMENTS

| | | |
|---|---|---|
| CN | 103763485 A | 4/2014 |
| CN | 104730535 A | 6/2015 |
| CN | 104914446 A | 9/2015 |
| CN | 105992960 A | 10/2016 |
| CN | 106405572 A | 2/2017 |
| CN | 110609293 A | 12/2019 |
| DE | 202013101039 U1 | 3/2014 |
| EP | 2157445 A2 | 2/2010 |
| EP | 2322953 A1 | 5/2011 |
| EP | 2469297 A1 | 6/2012 |
| EP | 2477043 A1 | 7/2012 |
| EP | 2827175 A2 | 1/2015 |
| EP | 3285087 A1 | 2/2018 |
| EP | 3318895 A1 | 5/2018 |
| EP | 3521856 A1 | 8/2019 |
| JP | H02287113 A | 11/1990 |
| JP | H0567195 A | 3/1993 |
| JP | 09197045 A | 7/1997 |
| JP | H10170637 A | 6/1998 |
| JP | H11063920 A | 3/1999 |
| JP | 2011089874 A | 5/2011 |
| JP | 2011237215 A | 11/2011 |
| JP | 2013113669 A | 6/2013 |
| JP | 2014059301 A | 4/2014 |
| KR | 101318951 B1 | 10/2013 |
| WO | 9008946 A1 | 8/1990 |
| WO | 2010149593 A1 | 12/2010 |
| WO | 2012154356 A1 | 11/2012 |
| WO | 2013028691 A1 | 2/2013 |
| WO | 2015199615 A1 | 12/2015 |
| WO | 2017106875 A1 | 6/2017 |
| WO | 2018122560 A1 | 7/2018 |
| WO | 2020101576 A1 | 5/2020 |
| WO | 2020109378 A1 | 6/2020 |
| WO | 2020201452 A1 | 10/2020 |

OTHER PUBLICATIONS

KR Application # 1020220101419 Office Action dated Sep. 28, 2022.
U.S. Appl. No. 17/026,365 Office Action dated Nov. 7, 2022.
U.S. Appl. No. 16/532,513 Office Action dated Nov. 23, 2022.
Charbon et al., "SPAD-Based Sensors", TOF Range-Imaging Cameras, Springer-Verlag, pp. 11-38, year 2013.
Niclass et al., "A 0.18 um CMOS SoC for a 100m range, 10 fps 200×96 pixel Time of Flight depth sensor", IEEE International Solid-State Circuits Conference—(ISSCC), Session 27, Image Sensors, 27.6, pp. 488-490, Feb. 20, 2013.
Walker et al., "A 128×96 pixel event-driven phase-domain ΔΣ-based fully digital 3D camera in 0.13µm CMOS imaging technology", IEEE International Solid-State Circuits Conference—(ISSCC), Session 23, Image Sensors, 23.6, pp. 410-412, Feb. 23, 2011.
Niclass et al., "Design and characterization of a 256×64-pixel single-photon imager in CMOS for a MEMS-based laser scanning time-of-flight sensor", Optics Express, vol. 20, issue 11, pp. 11863-11881, May 21, 2012.
Kota et al., "System Design and Performance Characterization of a MEMS-Based Laser Scanning Time-of-Flight Sensor Based on a 256×64-pixel Single-Photon Imager", IEEE Photonics Journal, vol. 5, issue 2, pp. 1-15, Apr. 2013.
Webster et al., "A silicon photomultiplier with >30% detection efficiency from 450-750nm and 11.6µm pitch NMOS-only pixel with 21.6% fill factor in 130nm CMOS", Proceedings of the European Solid-State Device Research Conference (ESSDERC), pp. 238-241, Sep. 7-21, 2012.
Bradski et al., "Learning OpenCV", first edition, pp. 1-50, O'Reilly Media, Inc, California, USA, year 2008.
Buttgen et al., "Pseudonoise Optical Modulation for Real-Time 3-D Imaging With Minimum Interference", IEEE Transactions on Circuits and Systems I: Regular Papers, vol. 54, Issue10, pp. 2109-2119, Oct. 1, 2007.
Morbi et al., "Short range spectral lidar using mid-infrared semiconductor laser with code-division multiplexing technique", Technical Digest, CLEO 2001, pp. 491-492, May 2001.
Ai et al., "High-resolution random-modulation cw lidar", Applied Optics, vol. 50, issue 22, pp. 4478-4488, Jul. 28, 2011.
Chung et al., "Optical orthogonal codes: design, analysis and applications", IEEE Transactions on Information Theory, vol. 35, issue 3, pp. 595-604, May 1989.
Lin et al., "Chaotic lidar", IEEE Journal of Selected Topics in Quantum Electronics, vol. 10, issue 5, pp. 991-997, Sep.-Oct. 2004.
EP Application # 20177707.5 Search Report dated Nov. 12, 2020.
U.S. Appl. No. 16/532,517 Office Action dated Oct. 14, 2020.
IN Application # 202117029897 Office Action dated Mar. 10, 2022.
IN Application # 202117028974 Office Action dated Mar. 2, 2022.
International Application # PCT/US2020/058760 Search Report dated Feb. 9, 2021.
TW Application # 109119267 Office Action dated Mar. 10, 2021.
U.S. Appl. No. 16/752,653 Office action dated Apr. 5, 2021.
U.S. Appl. No. 16/679,360 Office Action dated Jun. 29, 2022.
EP Application # 22167103.5 Search Report dated Jul. 11, 2022.
CN Application # 201780058088.4 Office Action dated Aug. 23, 2022.
U.S. Appl. No. 16/885,316 Office Action dated Jun. 30, 2022.
U.S. Appl. No. 16/532,513 Office Action dated Aug. 4, 2022.
CN Application # 201680074428.8 Office Action dated Jun. 23, 2021.

(56) References Cited

OTHER PUBLICATIONS

Zhu Jian, "Research of Simulation of Super-Resolution Reconstruction of Infrared Image", abstract page, Master's Thesis, p. 1, Nov. 15, 2005.
U.S. Appl. No. 16/752,653 Office Action dated Oct. 1, 2021.
EP Application # 17737420.4 Office Action dated Oct. 28, 2021.
KR Application # 1020200068248 Office Action dated Nov. 12, 2021.
KR Application # 1020207015906 Office Action dated Oct. 13, 2021.
JP Application # 2020001203 Office Action dated Feb. 4, 2021.
U.S. Appl. No. 16/752,653 Office Action dated Feb. 4, 2021.
U.S. Appl. No. 17/026,365 Office Action dated Jan. 26, 2023.
CN Application # 201780097602.5 Office Action dated Mar. 15, 2023.
CN Application # 202010063812.6 Office Action dated Mar. 18, 2023.
KR Application # 1020217025136 Office Action dated Apr. 4, 2023.

\* cited by examiner

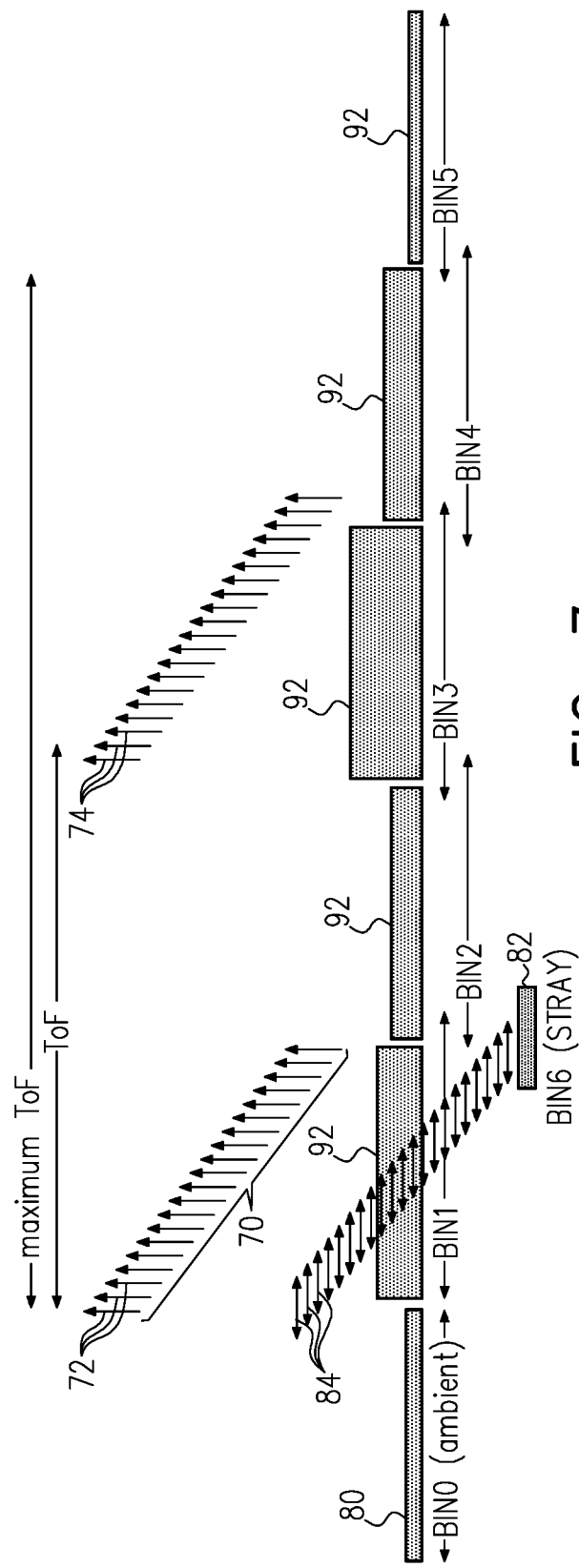

CONFIGURABLE ARRAY OF SINGLE-PHOTON DETECTORS

CROSS-REFERENCE TO RELATED APPLICATION

This application claims the benefit of U.S. Provisional Patent Application 62/942,761, filed Dec. 3, 2019, which is incorporated herein by reference.

FIELD OF THE INVENTION

The present invention relates generally to systems and methods for depth mapping, and particularly to sensor arrays used in time-of-flight sensing.

BACKGROUND

Time-of-flight (TOF) imaging techniques are used in many depth mapping systems (also referred to as 3D mapping or 3D imaging). In direct TOF techniques, a light source, such as a pulsed laser, directs pulses of optical radiation toward the scene that is to be mapped, and a high-speed detector senses the time of arrival of the radiation reflected from the scene. The depth value at each pixel in the depth map is derived from the difference between the emission time of the outgoing pulse and the arrival time of the reflected radiation from the corresponding point in the scene, which is referred to as the "time of flight" of the optical pulses.

Single-photon avalanche diodes (SPADs), also known as Geiger-mode avalanche photodiodes (GAPDs), are detectors capable of capturing individual photons with very high time-of-arrival resolution, of the order of a few tens of picoseconds. They may be fabricated in dedicated semiconductor processes or in standard CMOS technologies. Arrays of SPAD sensors, fabricated on a single chip, have been used experimentally in 3D imaging cameras.

U.S. Patent Application Publication 2017/0052065, whose disclosure is incorporated herein by reference, describes a sensing device that includes a first array of sensing elements, which output a signal indicative of a time of incidence of a single photon on the sensing element. A second array of processing circuits are coupled respectively to the sensing elements and comprise a gating generator, which variably sets a start time of the gating interval for each sensing element within each acquisition period, and a memory, which records the time of incidence of the single photon on each sensing element in each acquisition period. A controller controls the gating generator during a first sequence of the acquisition periods so as to sweep the gating interval over the acquisition periods and to identify a respective detection window for the sensing element, and during a second sequence of the acquisition periods, to fix the gating interval for each sensing element to coincide with the respective detection window.

SUMMARY

Embodiments of the present invention that are described hereinbelow provide improved apparatus and methods for optical sensing.

There is therefore provided, in accordance with an embodiment of the invention, optical sensing apparatus, including at least one semiconductor substrate and a first array of single-photon detectors, which are disposed on the at least one semiconductor substrate and are configured to output electrical pulses in response to photons that are incident thereon. A second array of counters are disposed on the at least one semiconductor substrate and are configured to count the electrical pulses output by the single-photon detectors. Routing and aggregation logic is configured, in response to a control signal, to connect the single-photon detectors to the counters in a first mode in which each of at least some of the counters aggregates and counts the electrical pulses output by a respective first group of one or more of the single-photon detectors, and in a second mode in which each of the at least some of the counters aggregates and counts the electrical pulses output by a respective second group of two or more of the single-photon detectors.

In a disclosed embodiment, the single-photon detectors includes single-photon avalanche diodes (SPADs).

In some embodiments, the control signal includes a gating signal, and the counters are configured to aggregate and count the electrical pulses over respective periods indicated by the gating signal. Typically, the gating signal causes different ones of the counters to aggregate and count the electrical pulses over different, respective gating intervals, so that the second array of counters outputs a histogram of the electrical pulses output by the single-photon detectors with bins defined responsively to the gating intervals. In disclosed embodiments, the apparatus includes a radiation source, which is configured to direct a series of optical pulses toward a target scene, and the single-photon detectors are configured to receive optical radiation that is reflected from the target scene, and the counters are configured to aggregate and count the electrical pulses while the gating intervals are synchronized with the optical pulses with a delay between the optical pulses and the gating intervals that is swept over a sequence of different delay times during the series of the optical pulses. In one embodiment, the counters are configured to aggregate and count the electrical pulses in first and second bins of the histogram while the gating intervals are swept over the sequence of different delay times, and the apparatus includes a processor, which is configured to compute a time of flight of the optical pulses by comparing respective first and second counts accumulated in the first and second bins.

Additionally or alternatively, in the first mode, each of the counters counts the electrical pulses that are output by a single, respective one of single-photon detectors. In some embodiments, in the second mode, each of the at least some of the counters aggregates and counts the electrical pulses output by at least four of the single-photon detectors that are mutually adjacent in the first array. In disclosed embodiments, the control signal includes a gating signal, which causes the counters to aggregate and count the electrical pulses over respective gating intervals, and the apparatus includes a radiation source, which is configured to direct a series of optical pulses toward a target scene, wherein the single-photon detectors are configured to receive optical radiation that is reflected from the target scene, and a processor, which is configured to compute a time of flight of the optical pulses responsively to counts of the electrical pulses that are output by the counters over different gating intervals while operating in the second mode, and to apply the computed time of flight in setting a gating interval for the counters in the first mode. In one embodiment, the processor is configured to generate a three-dimensional (3D) map of the target scene responsively to the time of flight computed in the second mode, to identify an object of interest in the 3D map, and to set the gating interval for the counters in the first mode responsively to a depth of the object of interest in the 3D map so as to acquire a two-dimensional (2D) image of the object of interest.

There is also provided, in accordance with an embodiment of the invention, a method for optical sensing, which includes providing, on at least one semiconductor substrate, a first array of single-photon detectors, which are configured to output electrical pulses in response to photons that are incident on the single-photon detectors, and a second array of counters, which are configured to count the electrical pulses output by the single-photon detectors. In response to a control signal, the single-photon detectors are connected to the counters in a first mode in which each of at least some of the counters aggregates and counts the electrical pulses output by a respective first group of one or more of the single-photon detectors, and in a second mode in which each of the at least some of the counters aggregates and counts the electrical pulses output by a respective second group of two or more of the single-photon detectors.

There is additionally provided, in accordance with an embodiment of the invention, a method for optical sensing, which includes directing a series of optical pulses toward a target scene and imaging optical radiation that is reflected from the target scene onto an array of single-photon detectors, which output electrical pulses in response to photons that are incident thereon. The electrical pulses output by the single photon detectors are counted in multiple different gating intervals that are synchronized with each of the optical pulses, including at least first and second gating intervals at different, respective delays relative to the optical pulses, while the delays are swept over a sequence of different delay times during the series of the optical pulses. A time of flight of the optical pulses is computed by comparing respective first and second counts of the electrical pulses that were accumulated in the first and second gating intervals over the series of the optical pulses.

In some embodiments, counting the electrical pulses includes aggregating the pulses over groups of mutually-adjacent single-photon detectors in the array.

Additionally or alternatively, the first and second gating intervals are synchronized at respective first and second delays relative to the optical pulses, such that a difference between the first and second delays remains fixed while the first and second delays are swept over the sequence of different delay times during the series of the optical pulses. In one embodiment, the second gating interval begins upon termination of the first gating interval. Alternatively, an initial part of the second gating interval overlaps with the first gating interval. Additionally or alternatively, the first and second gating intervals have a common, predefined duration, and the sequence of the different delay times spans the predefined duration.

In a disclosed embodiment, the gating intervals are selected responsively to a range of the target scene so that the photons in the series of the optical pulses that are reflected from the target scene are incident on the array of single-photon detectors only during the first and second gating intervals.

In some embodiments, the multiple different gating intervals include at least a third gating interval, such that the electrical pulses counted during the third gating interval are indicative of a background component of the optical radiation that is incident on the array of single-photon detectors, and computing the time of flight includes compensating for the background component in comparing the first and second counts. In one embodiment, the third gating interval is synchronized with the optical pulses so as to measure stray photons in the optical pulses that are incident on the array of single-photon detectors without having reflected from the target scene. Alternatively or additionally, the electrical pulses counted during the third gating interval are indicative of an ambient component of the optical radiation that is incident on the array of single-photon detectors. In a disclosed embodiment, computing the time of flight includes calculating a ratio of the first and second counts after subtraction of the background component counted during at least the third gating interval.

There is further provided, in accordance with an embodiment of the invention, apparatus for optical sensing, including a radiation source, which is configured to direct a series of optical pulses toward a target scene, and a first array of single-photon detectors, which are configured to receive optical radiation that is reflected from the target scene and to output electrical pulses in response to photons that are incident thereon. A second array of counters are configured to count the electrical pulses output by the single photon detectors in multiple different gating intervals that are synchronized with each of the optical pulses, including at least first and second gating intervals at different, respective delays relative to the optical pulses, while the delays are swept over a sequence of different delay times during the series of the optical pulses. A processor is configured to compute a time of flight of the optical pulses by comparing respective first and second counts of the electrical pulses that were accumulated in the first and second gating intervals over the series of the optical pulses.

The present invention will be more fully understood from the following detailed description of the embodiments thereof, taken together with the drawings in which:

BRIEF DESCRIPTION OF THE DRAWINGS

FIGS. 5-7 are timing diagram that schematically illustrates methods for measuring TOF to a target scene, in accordance with embodiments of the invention.

DETAILED DESCRIPTION OF EMBODIMENTS

Overview

Figure 1:
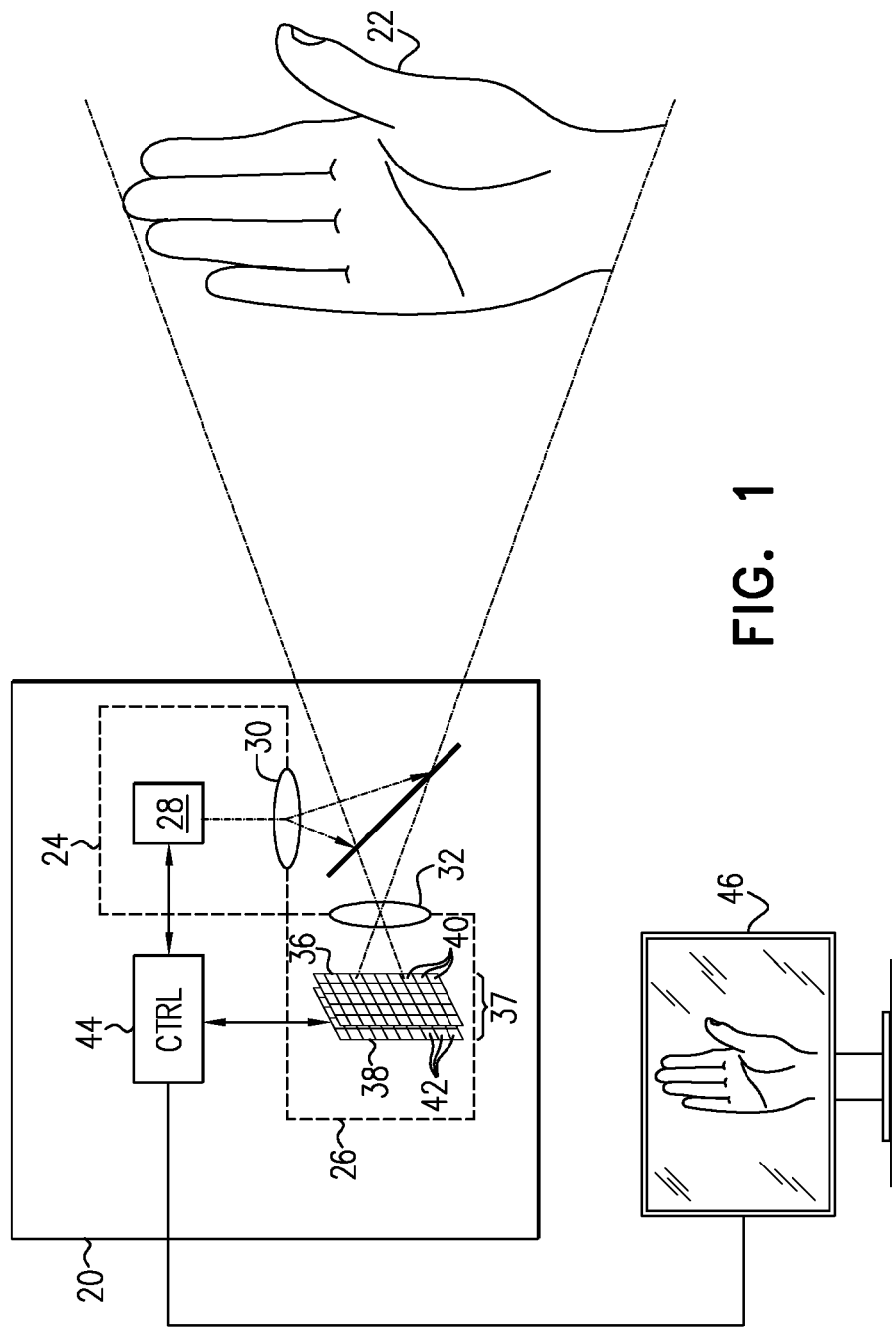
FIG. 1 is a schematic side view of depth mapping apparatus, in accordance with an embodiment of the invention.

The speed and sensitivity of single-photon detectors, such as SPADs, makes them a good choice for TOF imaging. SPAD arrays with integrated control logic and memory, such as those described above in the Background section, are starting to become commercially available. These integrated array devices, however, are still limited by the tradeoff of array pitch and power consumption against the spatial and depth resolution that they are capable of achieving.

Embodiments of the present invention that are described herein provide optical sensing apparatus and methods that address this tradeoff, and achieve more versatile SPAD array operation and more accurate depth mapping for a given array size and pitch.

Some embodiments provide optical sensing apparatus in which an array of single-photon detectors, such as SPADs, are disposed on a semiconductor substrate and output electrical pulses in response to incident photons. An array of counters, also disposed on the semiconductor substrate, count the electrical pulses output by the single-photon detectors. Routing and aggregation logic on the substrate is able to vary the configuration of the counters, relative to the detectors, in response to external control signals, and specifically to connect different groups of the single-photon detectors to different counters.

For example, in a first mode, each of the counters (or at least each of at least some of the counters) aggregates and counts the electrical pulses output by a respective first group of the single-photon detectors, which may even include only a single detector—meaning that each counter is connected to its own detector. In this mode it is also possible to create a two-dimensional (2D) image of a scene, in which the pixel values are given by the number of counts accumulated from each detector.

In a second mode, on the other hand, each of these counters aggregates and counts the electrical pulses output by a respective second group, which includes two or more of the detectors. Each counter can be gated to count the pulses it receives during a respective gating interval. In this manner, two or more counters with different gating intervals can be used together to construct a histogram of photon arrival times over the corresponding group of detectors. The gating intervals can be synchronized with optical pulses emitted by a radiation source in order to measure the times of flight of photons reflected from a target scene, and thus create a three-dimensional (3D) map of the scene.

If an object of interest (for example, a human face) is identified in such a 3D map, the gating interval for the counters in the first mode described above can then be set, relative to the optical pulses emitted toward the object, based on the depth of the object of interest in the 3D map. The detector array will thus acquire a 2D or 3D image of the object of interest with enhanced rejection of background radiation on account of the short, targeted gating interval that is applied.

In this sort of gated 3D acquisition, the gating intervals can made shorter, within the range of interest, thus narrowing the histogram bins and enhancing the depth resolution of the apparatus. Yet another benefit of the range-gating capabilities of the apparatus is the elimination of interference due to multi-path reflections, which propagate over a longer range and thus will reach the detector after the gate has closed. (In the absence of range gating, both direct and multi-path reflections will be detected in the histogram.) When the range to the target scene is known, the intensity of the radiation source can also be controlled as a function of the range, to avoid saturation of the detectors at short range and compensate for weaker signals at long range.

Other embodiments provide novel methods for TOF measurement using an array of single-photon detectors. These methods may be implemented advantageously using the aggregation and gated counting capabilities of the apparatus described above; but the methods may alternatively be performed using other sorts of single-photon detector arrays and gated counting logic.

In one of these embodiments, a series of optical pulses is directed toward a target scene, and optical radiation that is reflected from the target scene is imaged onto an array of single-photon detectors. Logic circuits associated with the array (such as the array of counters described above) count the electrical pulses output by the single photon detectors in multiple different gating intervals that are synchronized with each of the optical pulses, with each gating interval at a different, respective delay relative to the optical pulses. The delays of the gating intervals relative to the optical pulses are swept over a sequence of different delay times during the series of the optical pulses, and each counter accumulates the electrical pulses from the respective gating interval over the sequence of different delays. A processor computes the times of flight of the optical pulses simply by comparing the respective counts of the electrical pulses that were accumulated in two of the gating intervals over the series of the optical pulses.

As will be explained further hereinbelow, this approach is able to achieve high resolution in time of flight using only a small number of different gating intervals, due to the modulation of the delays between the optical pulses and the gating intervals. In fact, only two such gating intervals are required, although additional gating intervals can advantageously be used in order to measure and subtract out background components of the optical radiation that is incident on the detector array, for example due to stray photons and ambient radiation, as well as to enhance the temporal resolution.

System Description

FIG. 1 is a schematic side view of depth mapping apparatus 20, in accordance with an embodiment of the invention. In the pictured embodiment, apparatus 20 is used to generate depth maps of an object 22, for example a part of the body of a user of the apparatus. To generate the depth map, an illumination assembly 24 directs pulses of light toward object 22, and an imaging assembly 26 captures the photons reflected from the object. (The term "light," as used in the present description and in the claims, refers to optical radiation, which may be in any of the visible, infrared, and ultraviolet ranges; and pulses of light are equivalently referred to as "optical pulses.")

Illumination assembly 24 typically comprises at least one pulsed laser 28, which emits short pulses of light, with pulse duration in the picosecond to nanosecond range and high repetition frequency, for example 100 MHz or more. Collection optics 30 direct the light toward object 22. Alternatively, other source configurations, pulse durations and repetition frequencies may be used, depending on application requirements. For example, illumination assembly may emit multiple pulsed beams of light along different, respective axes, so as to form a pattern of spots on object 22. In this case, although the spatial resolution of apparatus 20 in the transverse plane may be reduced, the depth resolution can be enhanced by concentrating the histogram capture and processing resources of imaging assembly 26 in the areas of the spots.

Imaging assembly 26 comprises objective optics 32, which image object 22 onto a sensing array 34, so that photons emitted by illumination assembly 24 and reflected from object 22 are incident on the sensing array. In the pictured embodiment, sensing array 34 comprises sensing circuits 36 and ancillary circuits 38. Sensing circuits 36 comprises an array of single-photon detectors 40, such as SPADs, each of which outputs electrical pulses indicative of a time of incidence of a single photon that is incident on the sensing element. Ancillary circuits 38 comprises an array of processing circuits 42, which are coupled respectively to the sensing elements.

Circuits 36 and 38 are disposed on a semiconductor substrate, which may comprise a single chip or two or more separate chips, which are then coupled together, for example using chip stacking techniques that are known in the art. Circuits 36 and 38 may be formed on one or more silicon wafers using well-known CMOS fabrication processes, based on SPAD sensor designs that are known in the art, along with accompanying counters and logic as described hereinbelow. Alternatively, the designs and principles of detection that are described herein may be implemented, mutatis mutandis, using other materials and processes. All such alternative implementations are considered to be within the scope of the present invention.

Imaging device 20 is timed to capture TOF information continually over a series of image frames, for example at a rate of thirty frames/sec. In each frame, processing circuits 42 count photons that are incident on detectors 40 in one or more gating intervals and store the respective counts in histogram bins corresponding to the gating intervals. A system controller 44 reads out the individual counter values, computes the times of flight of the optical pulses responsively to the counter values, and generates an output depth map, comprising the measured TOF—or equivalently, the measured depth value—at each pixel. The depth map is typically conveyed to a receiving device 46, such as a display or a computer or other processor, which segments and extracts high-level information from the depth map. Controller 44 may also set imaging device to capture two-dimensional images, as is described further hereinbelow.

System controller 44 typically comprises a programmable processor, such as a microprocessor or embedded microcontroller, which is programmed in software or firmware to carry out the functions that are described herein. This software or firmware may be stored in tangible, non-transitory computer-readable media, such as optical, magnetic, or electronic memory media.

Alternatively or additionally, at least some of the processing functions of controller 44 may be carried out by hardwired or programmable digital logic circuits.

Structure and Operation of the Sensing Array

Figure 2:
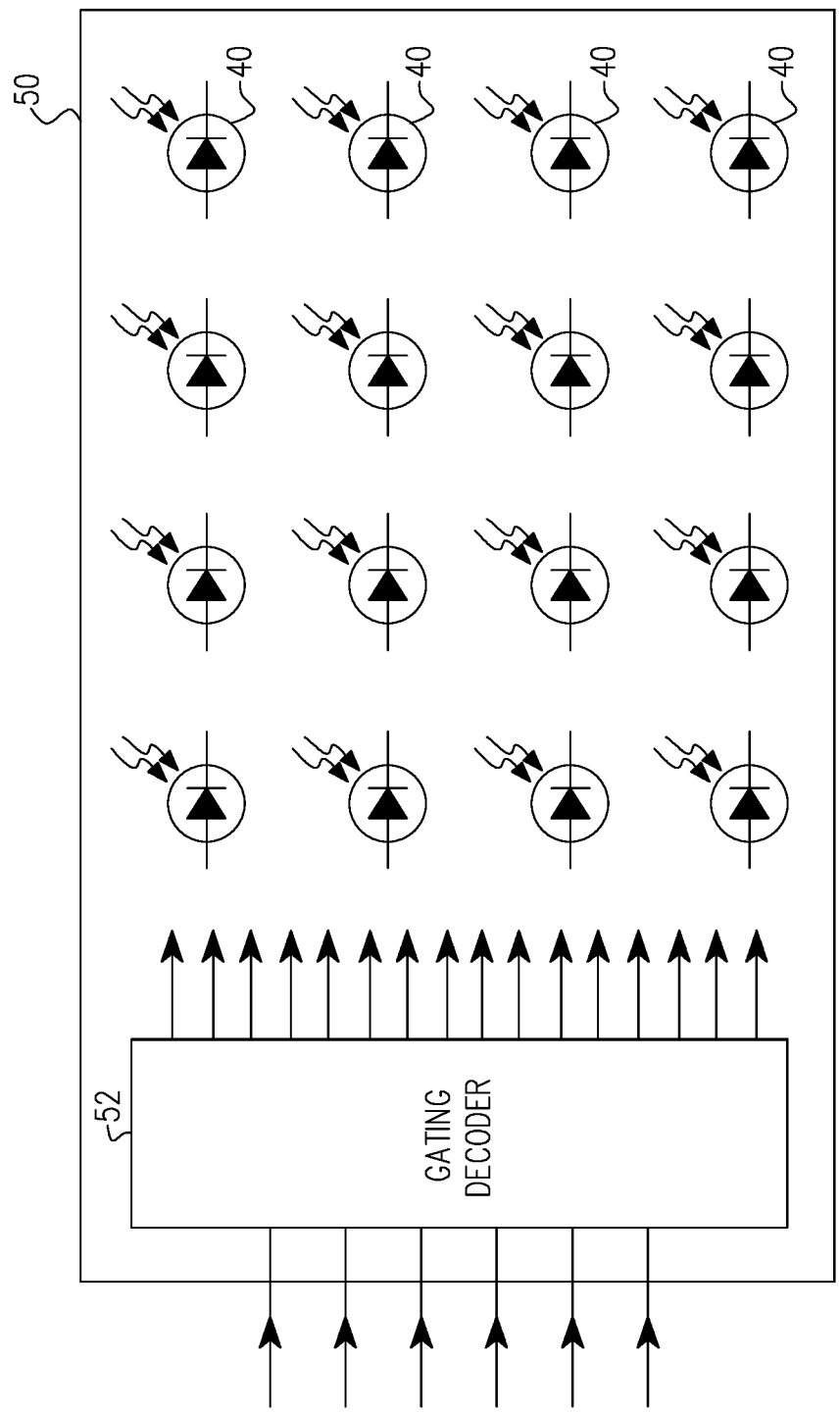
FIG. 2 is a block diagram showing detectors and processing circuits making up a super-pixel in a sensing array, in accordance with an embodiment of the invention.
Figure 3:
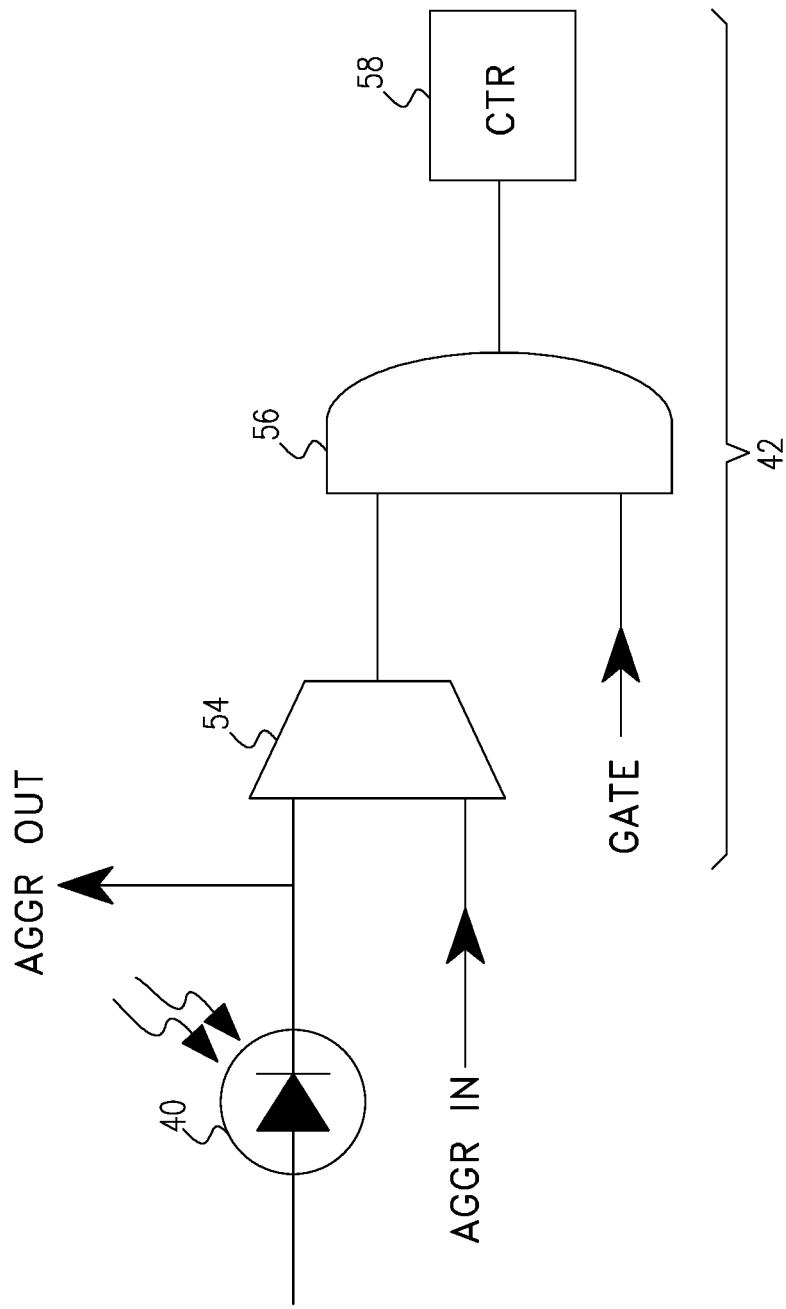
FIG. 3 is a block diagram showing details of routing and aggregation logic in a sensing array, in accordance with an embodiment of the invention.

Reference is now made to FIGS. 2 and 3, which are block diagrams showing details of detectors 40 and processing circuits 42, in accordance with an embodiment of the invention. FIG. 2 shows a super-pixel 50, which comprises a group of detectors 40 that share certain processing circuits, as described below. Sensing array 34 typically comprises a matrix of many super-pixels of this sort. In the pictured example, super-pixel 50 comprises sixteen detectors 40, which are mutually adjacent in array 34; but alternatively, array 34 may be divided into super-pixels comprising larger or smaller numbers of detectors. FIG. 3 shows routing and aggregation logic, including a counter 58, that is included in each processing circuit 42.

As shown in FIG. 3, the electrical pulses output by each detector 40 are both input to a respective multiplexer and output via an aggregation line to the other processing circuits 42 in super-pixel 50. Multiplexer 54 receives control signals (not shown) from routing and aggregation logic 52 (FIG. 2), which control the aggregation mode of processing circuit 42. For example, the aggregation lines and multiplexers in super-pixel 50 may operate in a first aggregation mode in which each counter 58 (or at least some of the counters) aggregates and counts the electrical pulses output by a respective first group of detectors 40; and this first group may be limited to the single, respective detector 40 that is coupled directly to processing circuit 42. In a second aggregation mode, each counter 58 aggregates and counts the electrical pulses output by a second group of two or more of detectors 40, typically including at least four detectors, and possibly all of the detectors in super-pixel 50.

Routing and control logic 52 also receives and decodes gating instructions from system controller 44, and accordingly outputs a gating signal to an AND gate 56 in each processing circuit 42. The gating signal controls the periods, i.e., the gating intervals, during which each counter 58 aggregates and counts the electrical pulses that are output from detectors 40 via multiplexer 54. System controller 44 typically synchronizes the gating intervals with the optical pulses emitted by illumination assembly 24. In a particular embodiment that is described below, with reference to FIGS. 5-7, the gating intervals are synchronized with the optical pulses with a delay between the optical pulses and the gating intervals that is swept over a sequence of different delay times during a series of the optical pulses.

In some operating configurations, and particularly when operating in the second aggregation mode mentioned above, the gating signals cause different counters 58 in super-pixel 50 to aggregate and count the electrical pulses over different, respective gating intervals. As a result, the array of counters 58 will effectively output a histogram of the electrical pulses output by detectors 40 in super-pixel 50, with each bin of the histogram defined by a corresponding gating interval. Thus, in the present example, routing and control logic 52 may configure the histogram to have anywhere from two to sixteen bins. Alternatively, the gating signals may be set (particularly in the first aggregation mode) so that all of counters 58 share the same gating interval.

Figure 4:
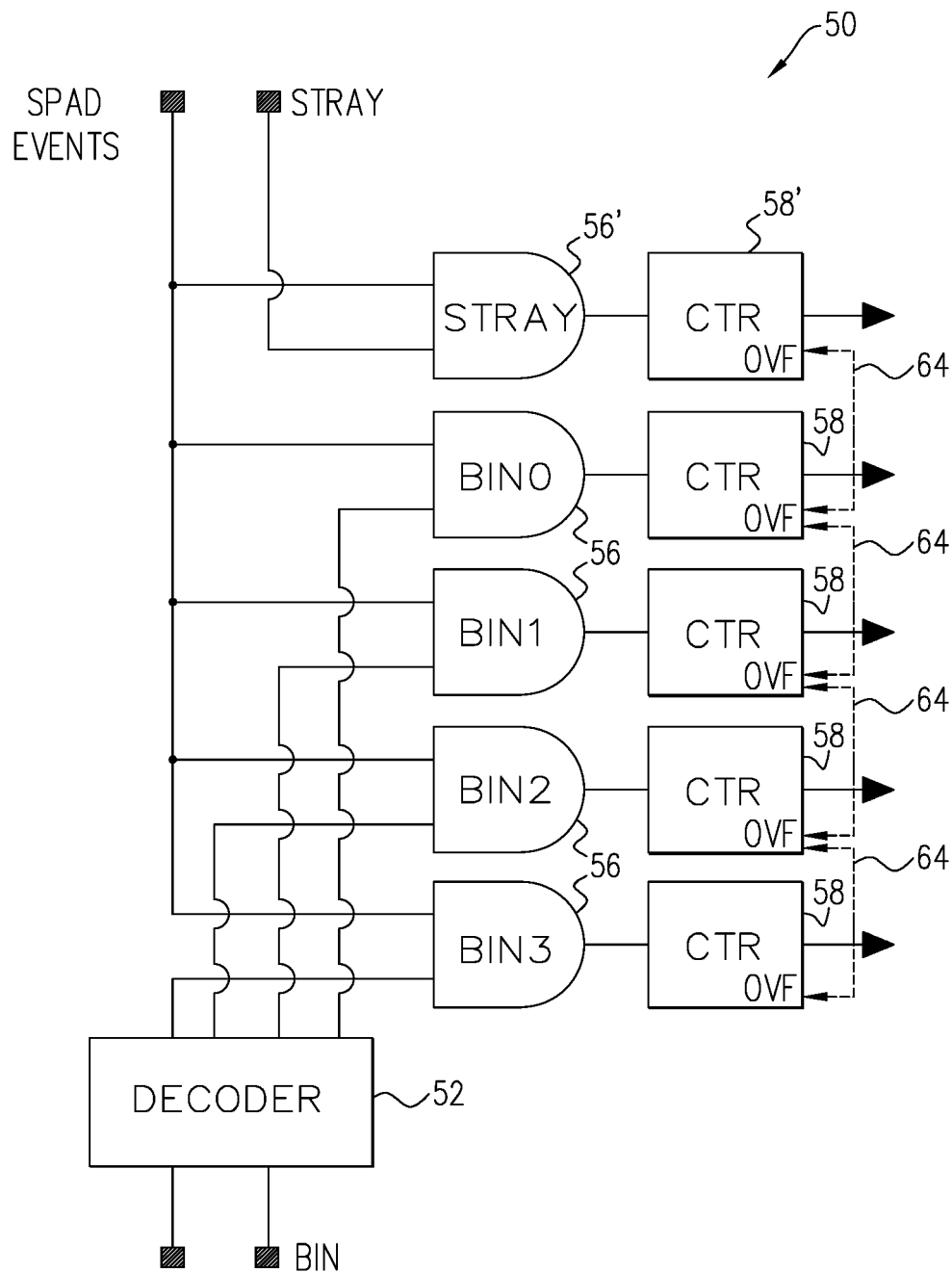
FIG. 4 is a block diagram that schematically illustrates an operating configuration of a super-pixel in an aggregation mode, in accordance with an embodiment of the invention.

FIG. 4 is a block diagram that schematically illustrates an operating configuration of super-pixel 50 in the second aggregation mode, in accordance with an embodiment of the invention. In this case, routing and control logic 52 has configured super-pixel 50 to generate a four-bin histogram: The outputs of all of detectors 40 in super-pixel 50 (labeled collectively as "SPAD events") are aggregated and input to AND gates 56, which are triggered by routing and control logic 52 to input the electrical pulses to respective counters 58 in different, respective gating intervals, at different respective delays relative to the optical pulses from illumination assembly 24. Counters 58 are interconnected by an overflow line 64, which stops all of the counters when one of them reaches saturation.

Based on the histogram generated by counters 58, system controller 44 computes the times of flight of the optical pulses that are emitted from illumination assembly and reflected back to each super-pixel 50. The system controller combines the TOF readings from the various super-pixels in array 34 in order to generate a 3D map of the target scene. In one embodiment, the system controller identifies an object of interest in the 3D map, for example object 22 (FIG. 1), and then sets the gating interval for counters 58 so that processing circuits 42 acquire a 2D image of the object of interest. In this 2D imaging mode, the gating interval and multiplexers 54 are set, based on the depth of the object of interest in the 3D map, so that each counter 58 will count only the electrical pulses output by the corresponding detector 40 during the interval in which optical pulses reflected from object 22 are expected to reach the detectors. Sensing array 34 will thus output a high-resolution 2D image of object 22, with low levels of background interference and noise.

In the embodiment shown in FIG. 4, another one of the AND gates, identified as gate 56' (labeled "stray"), is triggered to input electrical pulses from detectors 40 to a counter 58'. The gating interval applied to gate 56' is selected so that counter 58' receives and counts electrical pulses that are indicative of a background component of the optical radiation that is incident on detectors 40. In computing the time of flight, system controller 44 uses the value of counter 58' in compensating for the background component, and thus improving the accuracy of the histogram analysis.

For example, the gating interval applied to gate 56' can be synchronized with the optical pulses emitted by illumination assembly 24 so that counter 58' counts stray photons in the optical pulses that are incident on super-pixel 50 without having reflected from the target scene (in some cases due to photons with very short times of flight as a result of internal reflections within apparatus 20). Alternatively or additionally, the gating interval applied to gate 56' may be chosen to occur at a time during which optical pulses from illumination assembly are not expected to reach sensing array 34, for example at a long delay after emission of the pulses. In this case, the electrical pulses counted by counter 58' are indicative of the intensity of ambient optical radiation that is incident on super-pixel 50. Although only one background counter 58' is shown in FIG. 4, two or more such counters may alternatively be allocated in order to count both stray and ambient optical intensities.

TOF Measurement Using Modulated Gating Delays

Figure 5:
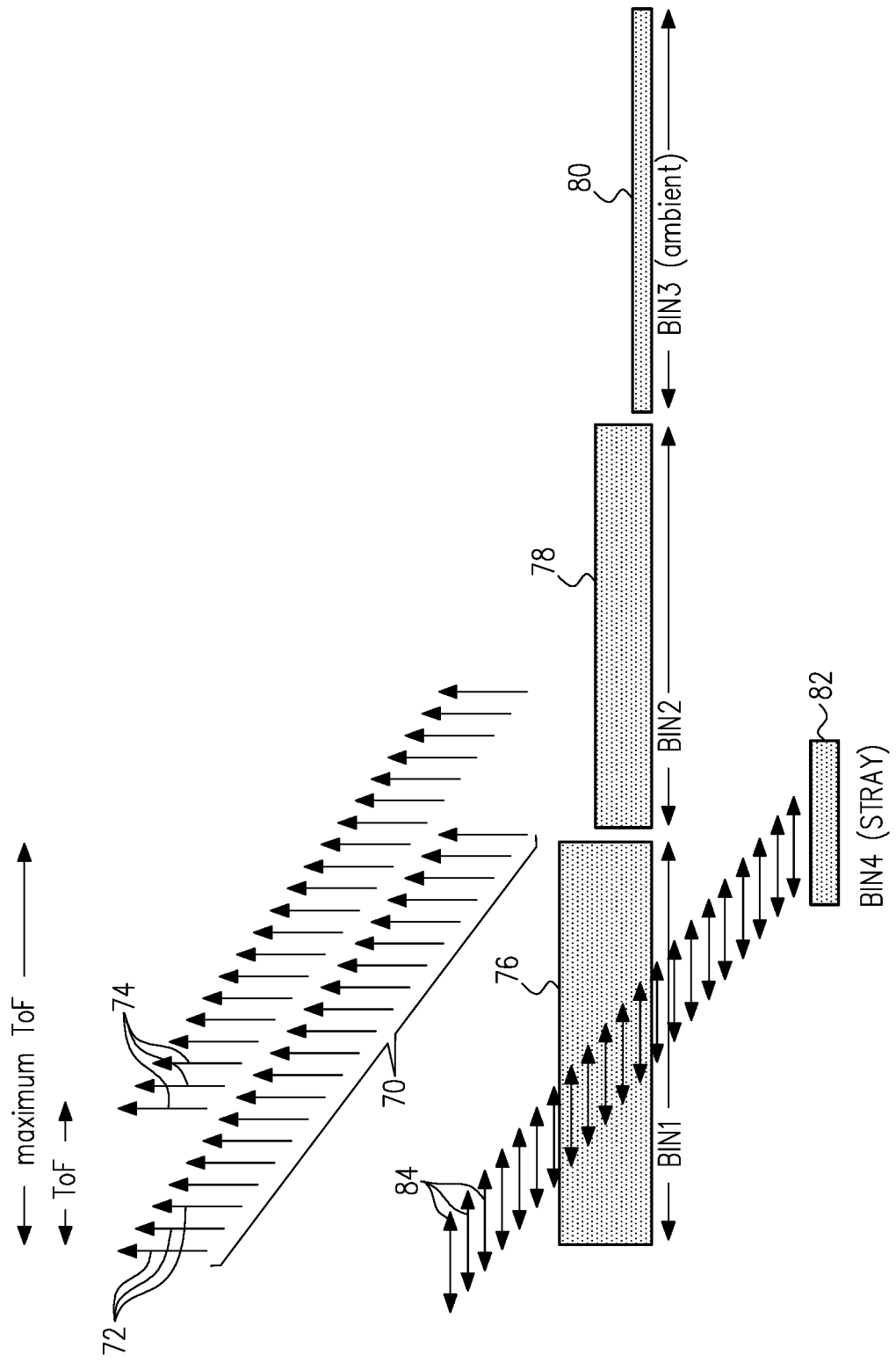

FIG. 5 is a timing diagram that schematically illustrates a method for measuring TOF to a target scene, in accordance with an embodiment of the invention. This method, as well as the methods illustrated in the figures that follow, will be described, for the sake of concreteness and clarity, with reference to the elements of apparatus 20, as described above and shown in the preceding figures. The principles of this embodiment, however, may similarly be applied using other sorts of sensing arrays with suitable gating and counting capabilities.

Specifically, FIG. 5 shows a series 70 of optical pulses 72 that are directed toward a target scene, such as object 22. The optical pulses are reflected from the target scene, giving rise to a corresponding series of reflected pulses, referred to as "echoes" 74, which are imaged onto super-pixels 50 in sensing array 34. When echoes 74 are incident on a given super-pixel 50, detectors 40 output corresponding electrical pulses with a delay, relative to the corresponding optical pulses 72, that is equal to the TOF of the optical pulses to and from the target scene.

Counters 58 are gated to count the electrical pulses output by the single photon detectors in multiple different gating intervals, which are synchronized with each of the optical pulses at different, respective delays relative to the optical pulses. The gating intervals are represented in FIG. 5 by corresponding bins 76 and 78, which hold the counts of the aggregated electrical pulses that are accumulated by the corresponding counters 58. Two additional bins 80 and 82 hold the counts of photons due to ambient and stray radiation, respectively, as explained above. Bin 82 receives echoes 84 occurring in close time proximity to each of optical pulses 72, substantially less than the expected TOF to the target scene.

The delays of bins 76 and 78 relative to optical pulses 72 are not fixed, but rather are swept over a sequence of different delay times during series 70 of the optical pulses. (In FIGS. 5-7, for clarity of illustration, the emission times of pulses 72 are shown as varying, while bins 76 and 78 are stationary, but the modulation of the delay times could equivalently be shown in terms of varying bin times relative to a stationary pulse time.) Bins 76 and 78 are synchronized at different, respective delays relative to optical pulses 72. The difference between the respective delays of bins 76 and 78 remains fixed, while both delays are swept over the sequence of different delay times during the series of the optical pulses.

In the specific scheme that is shown in FIG. 5, the durations of the gating intervals of bins 76 and 78 are both set to correspond to the maximum range of the target scene that is to be mapped by apparatus 20, with bin 78 beginning upon termination of bin 76. In other words, the temporal width of each bin 76, 78 is equal to the TOF of the optical pulses at the maximum range. Taking this maximum TOF to be T, the number of optical pulses 72 in series 70 to be N, and the additional dead time between successive optical pulses 72 to be D (due, inter alia, to the time needed by detectors 40 to recover after having output an electrical pulse), the pulse repetition interval (PRI) of the optical pulses is set to be PRI=2T+D+T/N+S. (The parameter S≥0 is chosen to account for dead time variation, control the average power of the pulsed illumination, and prevent range folding. Furthermore, S may be varied among successive series of pulses in order to mitigate the effects of electromagnetic and optical interference on other devices in the vicinity of apparatus 20.)

Thus, as shown in FIG. 5, series 70 spans the duration of bin 76 (which is equal to the duration of bin 78, as noted above). As a result of these choices of the durations of series 70 and bins 76 and 78, the photons in optical pulses 72 that are reflected from the target scene are incident on detectors 40 only during the gating intervals of bins 76 and 78

System controller 44 computes the TOF for super-pixel 50 by comparing the respective counts of the electrical pulses in bins 76 and 78 over series 70 of optical pulses 72. Specifically, in the present case, the system controller subtracts the ambient count in bin 80 from the counts in both of bins 76 and 78, and also subtracts the stray count in bin 82 from the count in bin 76, thus canceling out the background effects of ambient light and stray reflections. After subtracting these background components, system controller 44 computes the ratio R of the remainder of the count in bin 78 to the remainder of the count in bin 76. The TOF is proportional to the ratio, i.e., TOF=R*T. This approach enables system controller 44 to find depth coordinates with high resolution, even using only two bins for count accumulation.

Figure 6:
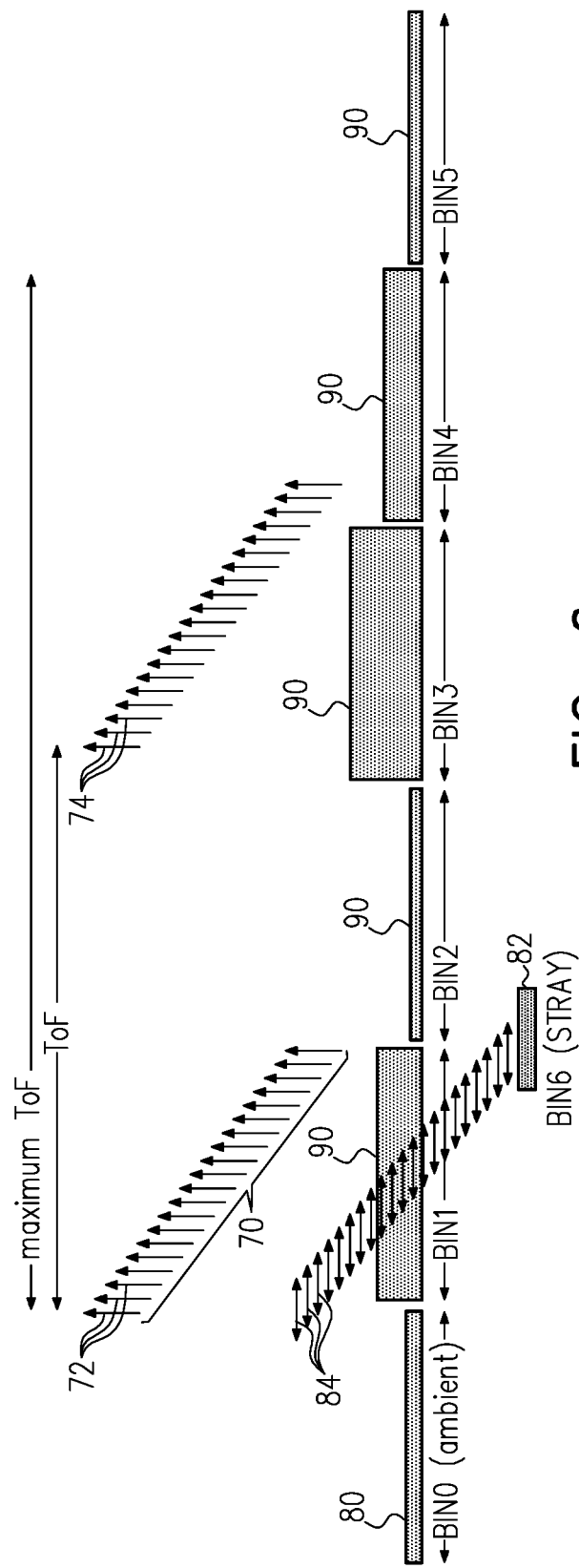

FIG. 6 is a timing diagram that schematically illustrates a method for measuring TOF to a target scene, in accordance with another embodiment of the invention. The principles of this method are similar to those of FIG. 5, except that in this case, the gating intervals of counters 58 in super-pixel 50 are set so as to define a larger number of successive bins 90 in which the electrical pulses from detectors 40 are aggregated, in order to enhance the resolution of the TOF measurement.

In the embodiment of FIG. 6, echoes 74 may be distributed over M+1 bins, wherein in the present example M=4 (in addition to background bins 80 and 82). The duration of the gating interval of each bin 90 is T/M. The PRI of optical pulses 72 in this case is set to the value $$PRI = \frac{M+1}{M}T + \frac{T}{MN} + D + S.$$

In the pictured example, the range of the target scene is such that echoes 74 are divided between bin 3 and bin 4, and the ratio of the counts in these bins (after subtraction of the ambient background) gives the TOF relative to the start time of bin 3.

FIG. 7 is a timing diagram that schematically illustrates a method for measuring TOF to a target scene, in accordance with yet another embodiment of the invention. This embodiment is similar to the embodiment of FIG. 6, except that in this case the counts of electrical pulses are aggregated in successive bins 92 with respective gating intervals that partially overlap one another. In other words, the initial part of each gating interval overlaps with the final part of the preceding gating interval.

The overlap in this embodiment reflects the fact that optical pulses 72 have a finite width. The overlap between the gating intervals of successive bins is typically on the order of the pulse width. In this case, the simple ratio formula presented above is not strictly accurate. The precise relation between the numbers of counts in the bins and the corresponding time of flight can be estimated, for example, using a maximum likelihood analysis or a suitably trained neural network. System controller 44 compares the counts in the various bins 92 using this relation, and thus computes the TOF for each super-pixel 50.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Optical sensing apparatus, comprising:
   at least one semiconductor substrate;
   a first array of single-photon detectors, which are disposed on the at least one semiconductor substrate and are configured to output electrical pulses in response to photons that are incident thereon;
   a second array of counters, which are disposed on the at least one semiconductor substrate and are configured to count the electrical pulses output by the single-photon detectors; and
   routing and aggregation logic, which is configured, in response to a control signal, to connect the single-photon detectors to at least some of the counters such that in a first mode, each counter among the at least some of the counters aggregates and counts the electrical pulses output by a respective first group of one or more of the single-photon detectors, and in a second mode, each counter among the at least some of the counters aggregates and counts the electrical pulses output by a respective second group, different from the first group, of two or more of the single-photon detectors.

2. The apparatus according to claim 1, wherein the single-photon detectors comprise single-photon avalanche diodes (SPADs).

3. The apparatus according to claim 1, wherein the control signal comprises a gating signal, and wherein the counters are configured to aggregate and count the electrical pulses over respective periods indicated by the gating signal.

4. The apparatus according to claim 3, wherein the gating signal causes different ones of the counters to aggregate and count the electrical pulses over different, respective gating intervals, so that the second array of counters outputs a histogram of the electrical pulses output by the single-photon detectors with bins defined responsively to the gating intervals.

5. The apparatus according to claim 4, and comprising a radiation source, which is configured to direct a series of optical pulses toward a target scene, and the single-photon detectors are configured to receive optical radiation that is reflected from the target scene, and
   wherein the counters are configured to aggregate and count the electrical pulses while the gating intervals are synchronized with the optical pulses with a delay between the optical pulses and the gating intervals that is swept over a sequence of different delay times during the series of the optical pulses.

6. The apparatus according to claim 5, wherein the counters are configured to aggregate and count the electrical pulses in first and second bins of the histogram while the gating intervals are swept over the sequence of different delay times, and the apparatus comprises a processor, which is configured to compute a time of flight of the optical pulses by comparing respective first and second counts accumulated in the first and second bins.

7. The apparatus according to claim 1, wherein in the first mode, each of the counters counts the electrical pulses that are output by a single, respective one of single-photon detectors.

8. The apparatus according to claim 7, wherein in the second mode, each of the at least some of the counters aggregates and counts the electrical pulses output by at least four of the single-photon detectors that are mutually adjacent in the first array.

9. The apparatus according to claim 8, wherein the control signal comprises a gating signal, which causes the counters to aggregate and count the electrical pulses over respective gating intervals, and
   wherein the apparatus comprises:
   a radiation source, which is configured to direct a series of optical pulses toward a target scene, wherein the single-photon detectors are configured to receive optical radiation that is reflected from the target scene; and
   a processor, which is configured to compute a time of flight of the optical pulses responsively to counts of the electrical pulses that are output by the counters over different gating intervals while operating in the second mode, and to apply the computed time of flight in setting a gating interval for the counters in the first mode.

10. The apparatus according to claim 9, wherein the processor is configured to generate a three-dimensional (3D) map of the target scene responsively to the time of flight computed in the second mode, to identify an object of interest in the 3D map, and to set the gating interval for the counters in the first mode responsively to a depth of the object of interest in the 3D map so as to acquire a two-dimensional (2D) image of the object of interest.

11. A method for optical sensing, comprising:
   providing, on at least one semiconductor substrate, a first array of single-photon detectors, which are configured to output electrical pulses in response to photons that are incident on the single-photon detectors;

providing, on the at least one semiconductor substrate, a second array of counters, which are configured to count the electrical pulses output by the single-photon detectors; and in response to a control signal, connecting the single-photon detectors to at least some of the counters such that in a first mode, each counter among the at least some of the counters aggregates and counts the electrical pulses output by a respective first group of one or more of the single-photon detectors, and in a second mode, each counter among the at least some of the counters aggregates and counts the electrical pulses output by a respective second group, different from the first group, of two or more of the single-photon detectors.

12. The method according to claim 11, wherein the control signal comprises a gating signal, which causes the counters to aggregate and count the electrical pulses over respective periods indicated by the gating signal.

13. The method according to claim 12, wherein the gating signal causes different ones of the counters to aggregate and count the electrical pulses over different, respective gating intervals, so that the second array of counters outputs a histogram of the electrical pulses output by the single-photon detectors with bins defined responsively to the gating intervals.

14. The method according to claim 13, and comprising directing a series of optical pulses toward a target scene, and receiving at the single-photon detectors optical radiation that is reflected from the target scene, and wherein the counters are configured to aggregate and count the electrical pulses while the gating intervals are synchronized with the optical pulses with a delay between the optical pulses and the gating intervals that is swept over a sequence of different delay times during the series of the optical pulses.

15. The method according to claim 14, wherein the counters are configured to aggregate and count the electrical pulses in first and second bins of the histogram while the gating intervals are swept over the sequence of different delay times, and the method comprises computing a time of flight of the optical pulses by comparing respective first and second counts accumulated in the first and second bins.

16. The method according to claim 11, wherein in the first mode, each of the counters counts the electrical pulses that are output by a single, respective one of single-photon detectors.

17. The method according to claim 16, wherein in the second mode, each of the at least some of the counters aggregates and counts the electrical pulses output by at least four of the single-photon detectors that are mutually adjacent in the first array.

18. The method according to claim 17, wherein the control signal comprises a gating signal, which causes the counters to aggregate and count the electrical pulses over respective gating intervals, and wherein the method comprises:
directing a series of optical pulses toward a target scene, wherein the single-photon detectors receive optical radiation that is reflected from the target scene;
computing a time of flight of the optical pulses responsively to counts of the electrical pulses that are output by the counters over different gating intervals while operating in the second mode; and
applying the computed time of flight in setting a gating interval for the counters in the first mode.

19. The method according to claim 18, and comprising computing a three-dimensional (3D) map of the target scene responsively to the time of flight computed in the second mode, identifying an object of interest in the 3D map, and setting the gating interval for the counters in the first mode responsively to a depth of the object of interest in the 3D map so as to acquire a two-dimensional (2D) image of the object of interest.

20. A method for optical sensing, comprising:
directing a series of optical pulses toward a target scene;
imaging optical radiation that is reflected from the target scene onto an array of single-photon detectors, which output electrical pulses in response to photons that are incident thereon;
counting the electrical pulses output by the single-photon detectors in multiple different gating intervals that are synchronized with each of the optical pulses, including at least first and second gating intervals at different, respective delays relative to the optical pulses, while the delays are swept over a sequence of different delay times during the series of the optical pulses, and including a third gating interval, such that a third count of the electrical pulses output by the single-photon detectors during the third gating interval is indicative of a background component of the optical radiation that is incident on the array of single-photon detectors; and
computing a time of flight of the optical pulses by comparing respective first and second counts of the electrical pulses that were accumulated in the first and second gating intervals over the series of the optical pulses while compensating for the background component using third count.

* * * * *